(12) United States Patent
Radic

(10) Patent No.: US 11,677,325 B2
(45) Date of Patent: Jun. 13, 2023

(54) DIGITAL NONLINEAR TRANSFORMATION FOR VOLTAGE-MODE CONTROL OF A POWER CONVERTER

(71) Applicant: Appulse Power Inc., Toronto (CA)

(72) Inventor: Aleksandar Radic, Toronto (CA)

(73) Assignee: Appulse Power Inc., Toronto (CA)

( * ) Notice: Subject to any disclaimer, the term of this patent is extended or adjusted under 35 U.S.C. 154(b) by 0 days.

(21) Appl. No.: 18/050,115

(22) Filed: Oct. 27, 2022

(65) Prior Publication Data

US 2023/0076899 A1 Mar. 9, 2023

Related U.S. Application Data

(63) Continuation of application No. 16/949,329, filed on Oct. 26, 2020, now Pat. No. 11,502,609.

(60) Provisional application No. 62/930,074, filed on Nov. 4, 2019.

(51) Int. Cl.
*H02M 3/335* (2006.01)
*H03M 1/12* (2006.01)
*H02M 1/00* (2006.01)

(52) U.S. Cl.
CPC ..... *H02M 3/33515* (2013.01); *H02M 1/0025* (2021.05); *H03M 1/12* (2013.01)

(58) Field of Classification Search
CPC ... H02M 3/33515; H02M 1/0025; H03M 1/12
See application file for complete search history.

(56) References Cited

U.S. PATENT DOCUMENTS

| 9,209,689 B2 | 12/2015 | Stevens |
| 2007/0108953 A1 | 5/2007 | Latham |
| 2010/0207594 A1 | 8/2010 | Davoudi et al. |
| 2011/0127983 A1 | 6/2011 | Peng et al. |
| 2014/0002042 A1 | 1/2014 | Wismar et al. |
| 2014/0035542 A1 | 2/2014 | Latham et al. |
| 2014/0313787 A1* | 10/2014 | Chen ........... H02M 3/3376 363/21.01 |
| 2015/0023066 A1* | 1/2015 | Kawashima ...... H02M 3/33546 363/21.02 |

OTHER PUBLICATIONS

International Search Report dated Jan. 29, 2021 for PCT Patent Application No. PCT/IB2020/060037.
Notice of Allowance and Fees dated Jul. 21, 2022 for U.S. Appl. No. 16/949,329.

* cited by examiner

*Primary Examiner* — Adolf D Berhane
*Assistant Examiner* — Afework S Demisse
(74) *Attorney, Agent, or Firm* — MLO, a professional corp.

(57) ABSTRACT

A power converter controller includes an analog to digital converter (ADC) to generate a digital representation of a feedback signal of a power converter, the feedback signal being received from a compensator of the power converter and being based on an output voltage of the power converter. A nonlinear gain block of the power converter controller receives the digital representation of the feedback signal and generates a transformed digital representation of the feedback signal using a nonlinear function. A switch control block of the power converter controller controls an on-time of a primary-side switch of the power converter based on the transformed digital representation of the feedback signal.

20 Claims, 8 Drawing Sheets

DIGITAL NONLINEAR TRANSFORMATION FOR VOLTAGE-MODE CONTROL OF A POWER CONVERTER

RELATED APPLICATIONS

This application is a continuation of U.S. patent application Ser. No. 16/949,329, filed Oct. 26, 2020, which claims priority to U.S. Provisional Patent Application No. 62/930,074, filed on Nov. 4, 2019, and entitled, "Digital Nonlinear Transformation for Voltage-Mode Control of a Power Converter", all of which are hereby incorporated by reference in their entirety and for all purposes.

BACKGROUND

Switch-mode power supplies (SMPSs) ("power converters") are widely utilized in consumer, industrial, and medical applications to provide well-regulated power while maintaining high power processing efficiency, tight-output voltage regulation, and reduced conducted and radiated electromagnetic interference (EMI).

Variation of input voltage when utilizing voltage-mode control of a power converter may significantly reduce an effective control loop crossover frequency, thereby reducing an achievable control loop bandwidth of the power converter. For example, with conventional voltage-mode control, an achievable control loop bandwidth at 90 Vac input voltage can be up to six-times less than that at 265 Vac (e.g., for a universal AC/DC flyback converter). This reduction in control loop bandwidth, in turn, forces a design of a control loop of the power converter to be set by 265 Vac operation which results in large output voltage ripple and poor load transient response at 90 Vac.

Current-mode control of the power converter can be utilized to eliminate the effects of input voltage variation on loop gain; however, current-mode control requires fast and accurate sensing of the current through one of the switching elements, slope compensation, as well as a comparator or digital-to-analog converter which can be hardware intensive (in both size and power).

An alternative method involves input voltage feedforward control which attenuates input voltage disturbances by introducing an additional fast control path from the input voltage to a control signal generation stage; however, feedforward control requires bulk voltage sensing. In the case of digital controllers, voltage sensing requires an additional analog-to-digital converter which can be hardware intensive (in both size and power).

SUMMARY

In some embodiments, a power converter controller includes an analog to digital converter (ADC) to generate a digital representation of a feedback signal of a power converter, the feedback signal being received from a compensator of the power converter and being based on an output voltage of the power converter. The power converter controller further includes a nonlinear gain block to receive the digital representation of the feedback signal and to generate a transformed digital representation of the feedback signal using a nonlinear function, and a switch control block to control an on-time of a primary-side switch of the power converter based on the transformed digital representation of the feedback signal.

In some embodiments, a power converter includes a transformer having primary-side windings and secondary-side windings. A primary-side switch of the power converter is coupled to the primary-side windings to control a primary-side current through the primary-side windings. An output buffer circuit of the power converter is coupled to the secondary-side windings to produce an output voltage of the power converter. A compensator of the power converter is operable to receive the output voltage and to produce a feedback signal based on the output voltage. A power converter controller of the power converter is operable to control an on-time and off-time of the primary-side switch based on the feedback signal. The power converter controller includes a nonlinear gain block to generate a transformed representation of the feedback signal using a nonlinear function, and a switch control block to control the on-time of the primary-side switch of the power converter based on the transformed representation of the feedback signal.

In some embodiments, a power converter controller includes a nonlinear gain block to receive a feedback signal of a power converter and to generate a transformed representation of the feedback signal using a nonlinear function, the feedback signal being received from a compensator of the power converter and being based on an output voltage of the power converter, and a switch control block to control an on-time of a primary-side switch of the power converter based on the transformed representation of the feedback signal.

DETAILED DESCRIPTION

In accordance with some embodiments, a digital nonlinear transformation of a feedback signal of a power converter advantageously achieves a higher small-signal control-to-output DC gain across a wide range of input voltages of the power converter for voltage-mode control operation, as compared to that of a conventional power converter. As compared to a conventional power converter, the digital nonlinear transformation of the feedback signal increases a crossover frequency of the power converter across the range of input voltages and reduces a quiescent current draw of the power converter.

Figure 1:
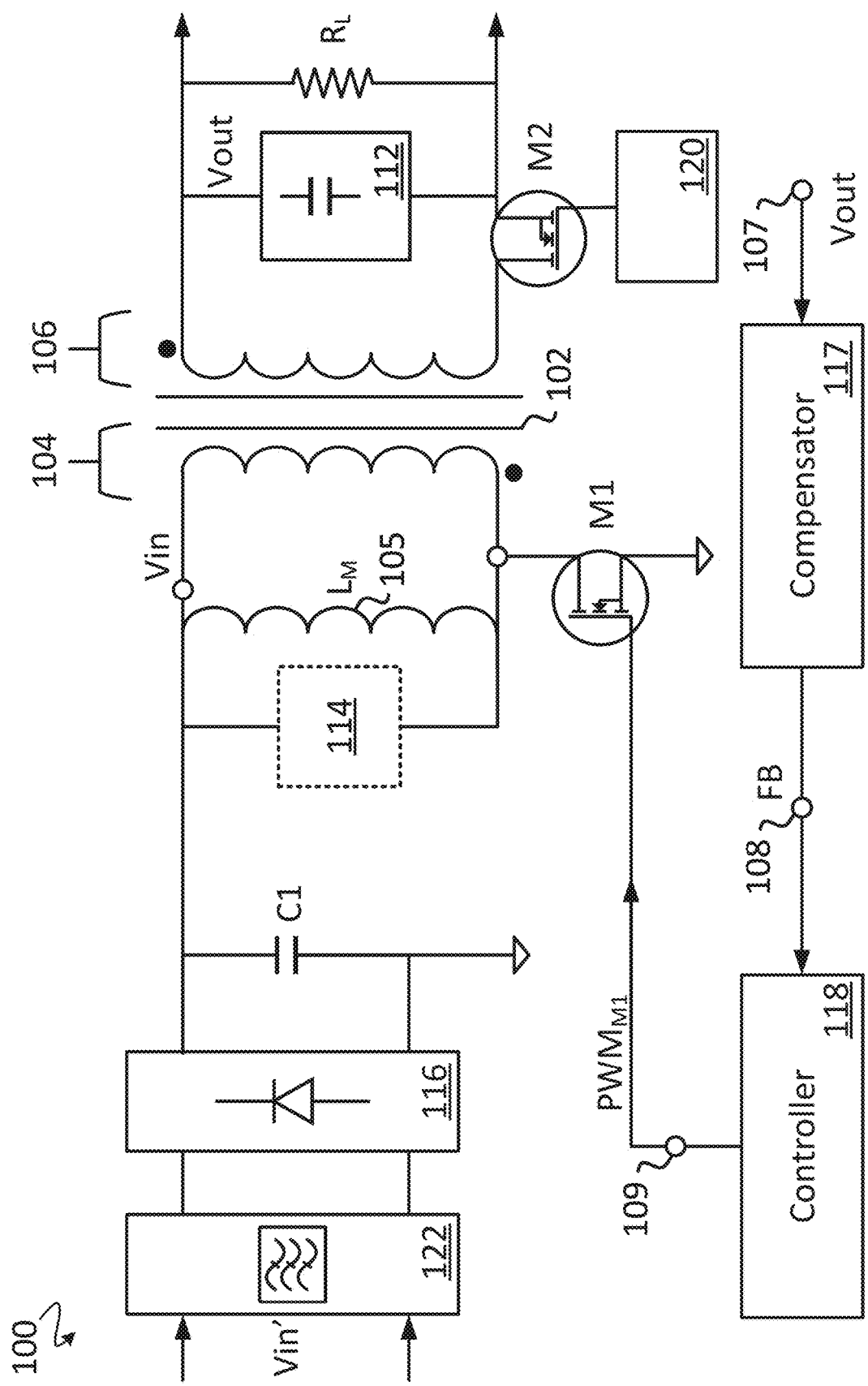
FIG. 1 is a simplified circuit schematic of a power converter, in accordance with some embodiments.

FIG. 1 is a simplified circuit schematic of a power converter 100, in accordance with some embodiments. Some elements of the power converter 100 have been omitted from FIG. 1 to simplify the description of power converter 100 but are understood to be present. In general, the power converter 100 includes a primary side (i.e., an input) configured to receive an input voltage Vin', and a secondary side (i.e., an output) configured to provide an output voltage Vout to a load $R_L$ using the input voltage Vin', the primary side being coupled to the secondary side by a transformer 102. The transformer 102 transfers power from the primary side of the power converter 100 to the secondary side of the power converter 100 and generally includes a primary winding 104 and a secondary winding 106. The primary side of the power converter 100 generally includes the primary winding 104 of the transformer 102, an input voltage filter block 122, a rectifier block 116 (in the case of AC input), an input voltage buffer capacitor C1, a primary-side switch M1, a power converter controller ("controller") 118, and an optional clamp or snubber circuit 114. A magnetizing inductance $L_M$ of the transformer 102 is illustrated as a winding 105. A compensator 117 is part of a control/feedback path from the secondary side of the power converter 100 to the primary side of the power converter 100 and is, thus, part of both the primary side and the secondary side. The secondary side of the power converter 100 generally includes the secondary winding 106 of the transformer 102, an output buffer circuit 112, a synchronous rectifier switch M2, and a synchronous rectifier switch controller circuit 120. Also shown are nodes 107, 108, 109, a primary-side switch control signal $PWM_{M1}$, the load $R_L$, and a power converter feedback signal FB.

The feedback path through the compensator 117 provides a measurement (i.e., the power converter feedback signal FB) based on the output voltage Vout to the power converter controller 118. Depending on the type of compensator 117 implemented (e.g., PI, Type I, Type, II, Type III, etc.), as determined by design requirements of the power converter 100, the feedback signal FB is an amplified, attenuated, filtered, and/or otherwise conditioned indication of the output voltage Vout as it compares to a target voltage (i.e., a desired output voltage) of the power converter 100 (e.g., an error signal). In some embodiments, the power converter feedback signal FB produced by the compensator 117 is galvanically isolated from the secondary side of the power converter 100 (e.g., via optical isolation, capacitive isolation, digital isolation, etc.).

The voltage source Vin' is received at the power converter 100. Vin' can be provided either as an alternating current (AC) or direct current (DC). The input voltage filter block 122, rectifier block 116, and the input buffer capacitor C1 provide a filtered, buffered, rectified, or otherwise conditioned input voltage Vin to the transformer 102. The transformer 102 transfers power from the primary side of the power converter 100 to the secondary side of the power converter 100.

The primary winding 104 receives the input voltage Vin. The primary winding 104 is electrically coupled in series to a drain node of the primary-side switch M1, and a source node of the primary-side switch M1 is electrically coupled to a voltage bias node such as ground (illustrated as a triangle). The primary-side switch M1 is controlled by the pulse-width-modulation (PWM) control signal $PWM_{M1}$ generated by the power converter controller 118. The switch control signal $PWM_{M1}$ is characterized by an on-time $t_{on}$, an off-time $t_{off}$, and a switching frequency $f_s$. A ratio of the on-time $t_{on}$ to the off-time $t_{off}$ of the switch control signal $PWM_{M1}$ is expressed as the duty-cycle D of the switch control signal $PWM_{M1}$. For a fixed (or substantially fixed) switching frequency $f_{sw}$, as the on-time $t_{on}$ increases, the off-time $t_{off}$ decreases, and the duty-cycle D is said to increase. Similarly, as the on-time $t_{on}$ decreases, the off-time $t_{off}$ increases, and the duty-cycle D is said to decrease.

The primary-side switch M1 controls, in response to the switch control signal $PWM_{M1}$, a primary-side current through the primary winding 104 to charge the magnetizing inductance $L_M$ 105 of the transformer 102 during a first portion of a switching cycle of the power converter 100 (i.e., during the on-time $t_{on}$ of the primary-side switch M1). The synchronous rectifier switch M2 controls a secondary-side current flow through the secondary winding 106 to discharge the transformer 102 into output buffer circuit 112 and the load $R_L$ during a subsequent portion of the switching cycle (i.e., during the off-time $t_{off}$ of the primary-side switch M1).

To elaborate, when the primary-side switch M1 is enabled by the power converter controller 118 during the first portion of the switching cycle, the primary-side current flows through the primary winding 104 to the voltage bias node. The primary-side current flow through the primary winding 104 causes energy to be stored in the magnetizing inductance $L_M$ 105 and a leakage inductance $L_L$ (not shown) of the transformer 102. When the primary-side switch M1 is disabled, and the synchronous rectifier switch M2 is enabled, in the subsequent portion of the switching cycle, output voltage Vout is generated at the output buffer circuit 112 and is provided to the load $R_L$.

In general, as the on-time $t_{on}$ of the switch control signal $PWM_{M1}$ increases (and the off-time $t_{off}$ decreases) for an increasing duty-cycle D, the on-time of the primary-side switch M1 correspondingly increases, and the output voltage Vout increases. Likewise, in general, as the on-time $t_{on}$ of the switch control signal $PWM_{M1}$ decreases (and the off-time $t_{off}$ increases) for a decreasing duty-cycle D, the on-time of the primary-side switch M1 correspondingly decreases, and the output voltage Vout decreases. Thus, the output voltage Vout is regulated, in general, based on adjusting the on-time $t_{on}$ of the switch control signal $PWM_{M1}$.

A small-signal control-to-output DC gain $G_{dc}$ of the power converter 100 is approximately equal to:

$$G_{dc} = n \times \frac{Vout}{D} \tag{1}$$

where n is a primary to secondary side winding turns ratio of the transformer 102, Vout is the output voltage of the power converter 100, and D is the primary-side switch M1 duty-cycle (i.e., of the switch control signal $PWM_{M1}$) discussed above. The duty-cycle D is relative to the feedback signal FB of the power converter 100. For example, if a voltage level of the feedback signal FB received at the power converter controller 118 indicates that the output voltage Vout of the power converter 100 is too low (e.g., as compared to a target voltage), the power converter controller 118 will increase the duty-cycle D of the switch control signal $PWM_{M1}$ to increase the on-time $t_{on}$ of the primary-side switch M1 to thereby increase the output voltage Vout. Similarly, if a voltage level of the feedback signal FB received at the power converter controller 118 indicates that the output voltage Vout of the power converter 100 is too high (e.g., as compared to the target voltage), the power converter controller 118 will decrease the duty-cycle D of the switch control signal PWM$_{M1}$ to decrease the on-time t$_{on}$ of the primary-side switch M1 to decrease the output voltage Vout.

Power converters, such as the power converter 100, may be used with a variety of different input voltage regimes or operating points (e.g., based on the application of the power converter). Accordingly, the input voltage Vin' of a power converter may be lower in some voltage regimes (e.g., 90 Vac) and higher in other voltage regimes (e.g., 265 Vac).

As the input voltage Vin', and ultimately Vin, decreases for a given operating point of the power converter 100, the on-time t$_{on}$ of the primary-side switch M1 correspondingly increases, resulting in reduced control-to-output dc gain G$_{dc}$. That is, to produce the same output voltage Vout of the power converter 100, the on-time t$_{on}$ of the primary-side switch M1 is longer for a lower input voltage Vin' and shorter for a higher input voltage Vin'.

As illustrated in Equation 1, this is because as the on-time of the primary-side switch M1 increases, the duty-cycle D increases, thereby producing a smaller ratio of Vout to D. A reduced control-to-output dc gain G$_{dc}$ negatively affects (e.g., lowers) an achievable crossover frequency of the power converter 100.

Figure 2:
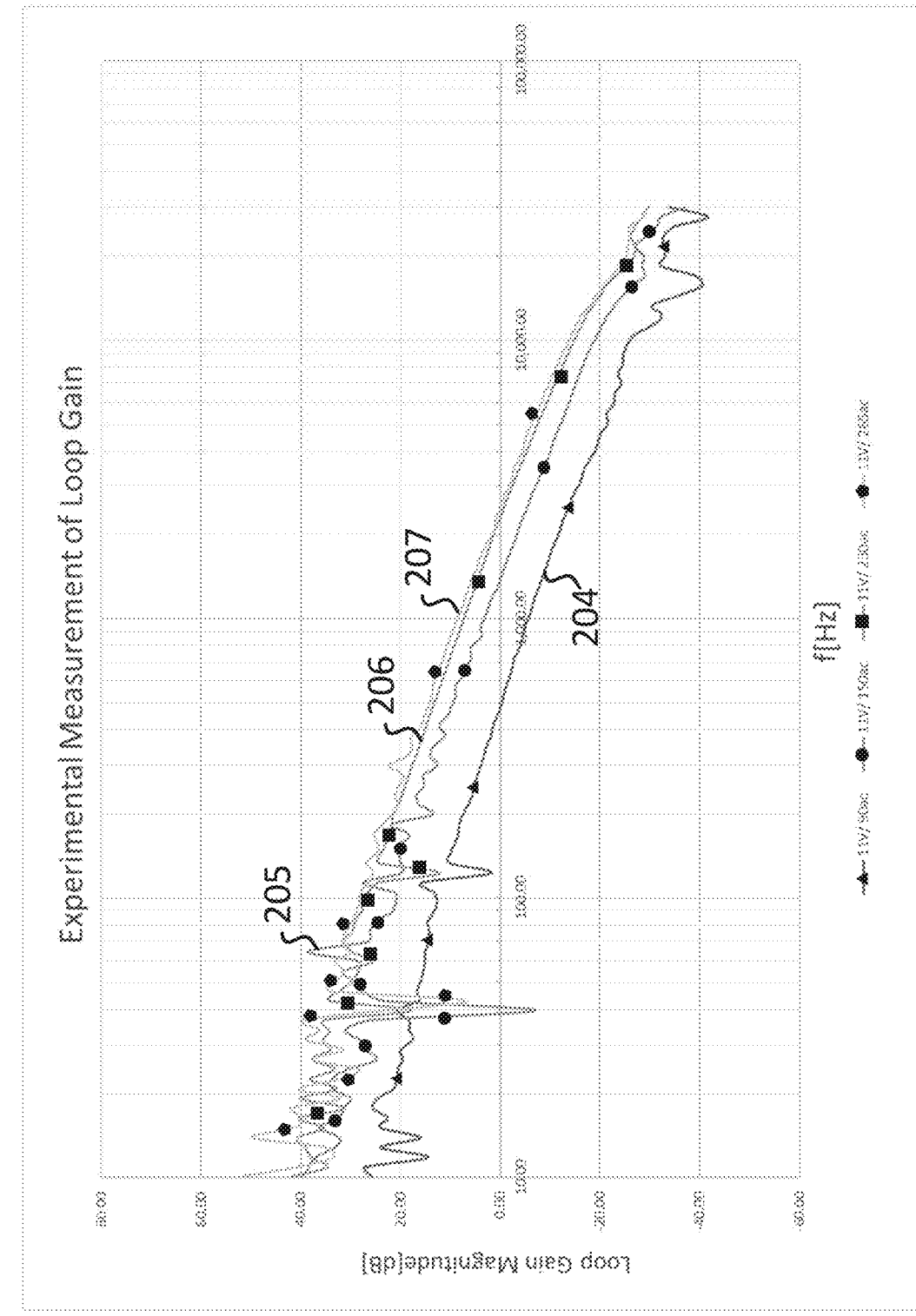
FIG. 2 shows simplified plots of signals related to operation of a conventional power converter.

FIG. 2 includes simplified plots 202 of signals 204, 205, 206, 207 related to operation of a conventional power converter (e.g., a flyback converter). The plots 202 illustrate an achievable crossover frequency for voltage-mode control of the conventional power converter for 90/150/230/265 Vac (input, e.g., Vin') operation at 11V/30 W (output). As shown by the signals 206/207, a crossover frequency for Vin'=230/265 Vac operation is about 2 kHz. As shown by the signal 205, a crossover frequency for Vin'=150 Vac operation is about 1.3 k-1.5 k. However, as shown by the signal 204, a crossover frequency for Vin'=90 Vac operation is only slightly less than 500 Hz. The significantly lower crossover frequency for 90 Vac operation negatively affects control of the conventional power converter by reducing the ability to quickly respond to transients and increasing ripple at the output.

Figure 3:
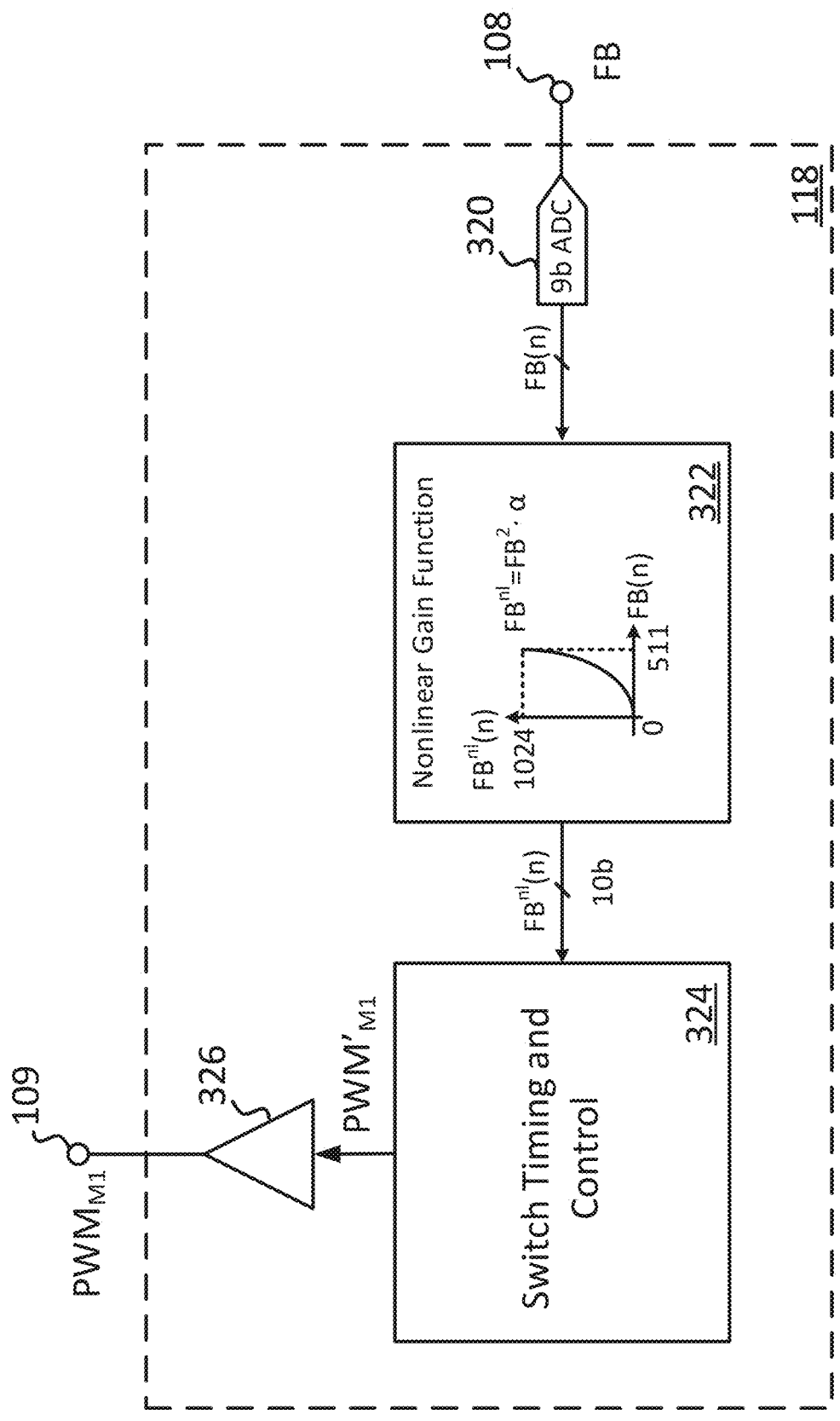
FIG. 3 is a simplified circuit schematic of a power converter controller for use in the power converter shown in FIG. 1, in accordance with some embodiments.

FIG. 3 is a simplified circuit schematic of a portion of the power converter controller 118 of the power converter 100 shown in FIG. 1, in accordance with some embodiments. The power converter controller 118 generally includes an analog-to-digital converter (ADC) 320, a nonlinear gain block 322, a switch timing and control block 324 ("switch control block"), and a gate driver circuit 326, coupled as shown. Some elements of the power converter controller 118 have been omitted from FIG. 3 to simplify the description of power converter controller 118 but are understood to be present. In some embodiments, the nonlinear gain block 322 and the switch timing and control block 324 are implemented using one or more processors (e.g., microcontrollers, microprocessors, DSPs, ASICs, FPGAs), volatile data storage, non-volatile data storage, and/or communication modules. In some embodiments, the switch timing and control block 324 uses such processors to adjust a timing (e.g., t$_{on}$, t$_{off}$, f$_{sw}$) of the PWM signal PWM'$_{M1}$ using one or more clocks, counting, delay, and/or timing blocks (not shown) as are known and understood in the art. In other embodiments, the nonlinear gain block 322 and/or the switch timing and control block 324 are implemented using analog circuits, as are known and understood in the art. In some such embodiments, an analog representation of the feedback signal FB is received at the nonlinear gain block 322.

In the example shown, the nonlinear gain block is illustrated as a quadratic equation having an input range of 0-511 and an output range of 0-1024 and embodying Equation 2, shown below. However, other suitable input and output ranges may be used depending on design constraints and criteria.

The switch timing and control block 324 generates a switching signal PWM'$_{M1}$ which is received by the gate driver circuit 326. The gate driver circuit 326 buffers, level-shifts, or otherwise conditions the switching signal PWM'$_{M1}$ to make a suitable switch control signal PWM$_{M1}$ for turning the primary-side switch M1 on and off. The switch timing and control block 324 thereby controls the on-time t$_{on}$ and the off-time t$_{off}$, and thereby the duty-cycle D, of the primary-side switch M1 via the switch control signal PWM$_{M1}$ generated by the gate driver circuit 326 while keeping the switching frequency f$_{sw}$ of the primary-side switch M1 substantially constant.

In the example shown, the ADC 320 receives the feedback signal FB (e.g., from the compensator 117) and generates a digital representation FB(n) of the feedback signal. In the example shown, the ADC 320 is a 9-bit ADC. In other embodiments, a different appropriate bit-depth of the ADC 320 may be used. The nonlinear gain block 322 receives the digital representation FB(n) of the feedback signal FB and generates a transformed digital representation FB$^{nl}$(n) (e.g., a 10-bit signal) of the feedback signal FB using a nonlinear function. That is, the transformed digital representation FB$^{nl}$(n) is an input to, and is operated upon by, the non-linear function, e.g., using a microcontroller, microprocessor, ASIC, and/or FPGA of the power converter controller 118. In the example shown, the nonlinear function is embodied as:

$$FB^{nl}(n)=FB(n)^2 \times \alpha \qquad (2)$$

where α is a gain scalar that can be used to account for an increased bit depth of the resultant transformed digital representation and/or to adjust a gain as desired. In some embodiments, a is equal to about 0.004 (e.g., 0.003918). In general, the nonlinear function is a function that is operable to transform the digital representation FB(n) of the feedback signal FB such that a total DC gain of the power converter 100 is independent of the on-time t$_{on}$ of the primary-side switch M1, as controlled by the switch control signal PWM$_{M1}$, the on-time t$_{on}$ varying with the input voltage Vin'.

In the example shown, the nonlinear function is a quadratic function. In other embodiments, the nonlinear function can be of a higher order, and/or be a polynomial function. In the example shown in Equation 2, the nonlinear function performed by the non-linear gain block 322 squares the digital representation FB(n) of the feedback signal FB. Additionally, the nonlinear function performed by the nonlinear gain block 322 scales the squared digital representation FB(n) of the feedback signal FB. Thus, the nonlinear function performed by the non-linear gain block cannot be said to merely perform a nonlinear filtering of the digital representation FB(n) of the feedback signal.

The transformed digital representation FB$^{nl}$(n) is received by the switch timing and control block 324, which controls the duty-cycle of the switch control signal PWM$_{M1}$ (i.e., via the PWM signal PWM'$_{M1}$) based on the transformed digital representation FB$^{nl}$(n). The switch timing and control block 324 controls the duty-cycle of the switching signal PWM'$_{M1}$ using any appropriate clock and/or PWM generation circuit (analog or digital), module, or software instruction as is known and understood in the art.

If the transformed digital representation $FB^{nl}(n)$ received at the switch timing and control block 324 indicates that the output voltage Vout of the power converter 100 is too low (e.g., as compared to a target voltage determined by the compensator 117), the switch timing and control block 324 increases the on-time $t_{on}$, and thereby the duty-cycle, of the switch control signal $PWM_{M1}$ such that the output voltage Vout increases. Similarly, if the transformed digital representation $FB^{nl}(n)$ received at the switch timing and control block 324 indicates that the output voltage Vout of the power converter is too high (e.g., as compared to a target voltage determined by the compensator 117), the switch timing and control block 324 decreases the on-time $t_{on}$, and thereby the duty-cycle, of the switch control signal $PWM_{M1}$ such that the output voltage Vout decreases. Thus, in some embodiments, as a digital value of the transformed digital representation $FB^{nl}(n)$ increases, the on-time of the primary-side switch M1 increases.

The gain $G_{dc}^{NL}$ of the non-linear function is equal to the derivative of the non-linear function (i.e., the slope of the non-linear function), and is given by:

$$G_{dc}^{NL} \approx 2 \times \alpha \times FB = 2 \times \alpha \times t_{on} \quad (3)$$

where $t_{on}$ is the on-time of the primary-side switch M1 in accordance with the duty-cycle D of the switch control signal $PWM_{M1}$. As such, a small-signal control-to-output DC gain of the power converter 100 is approximately equal to the product of the gain of non-linear function $G_{dc}^{NL}$ times the DC gain $G_{dc}$, the product given by:

$$G_{dc}^{NL} \times G_{dc} \approx 2 \times \alpha \times t_{on} \times n \times \frac{Vout}{t_{on} \times f_{sw}} = 2 \times \alpha \times n \times \frac{Vout}{f_{sw}} \quad (4)$$

where the switching frequency $f_{sw}$ of the primary-side switch M1 generally remains unchanged and is usually tightly controlled (i.e., the switching frequency $f_{sw}$ is tightly regulated). Thus, advantageously, a total DC gain of the power converter 100 (i.e., the product of $G_{dc}^{NL} \times G_{dc}$) is independent of the on time $t_{on}$ of the switch control signal $PWM_{M1}$, which varies with input voltage Vin'. As such, as the input voltage Vin' of the power converter 100 varies (e.g., based on different power regimes), the total DC gain of the power converter 100 is largely unaffected, providing for better control across a wide-range of input voltages as compared to a conventional power converter.

Figure 4:
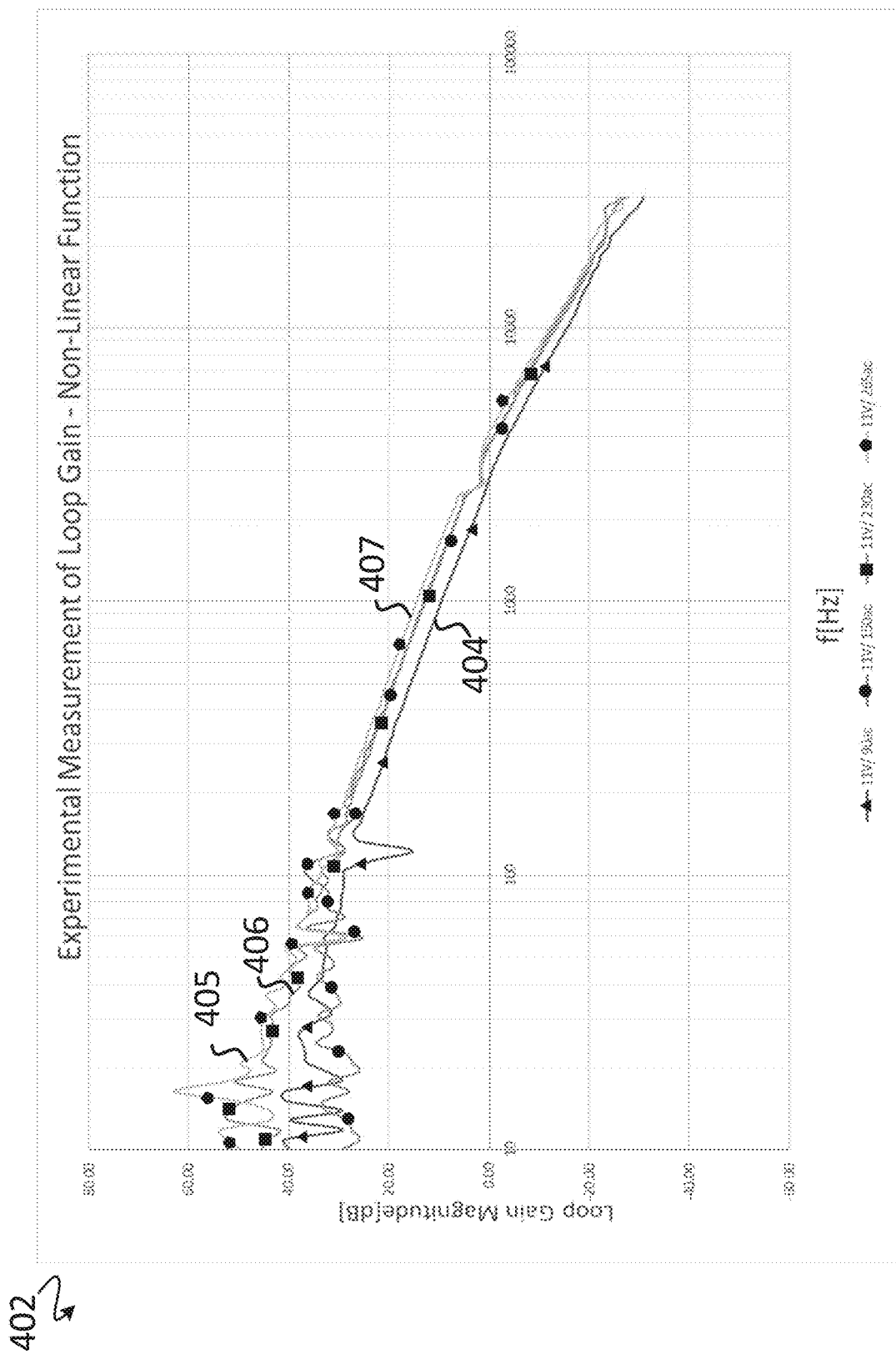
FIG. 4 shows simplified plots of signals related to operation of the power converter shown in FIG. 1, in accordance with some embodiments.

FIG. 4 includes simplified plots 402 of signals 404, 405, 406, 407 related to operation of the power converter 100, in accordance with some embodiments. The plots 402 illustrate an achievable crossover frequency for voltage-mode control of the power converter 100 using the nonlinear function (equation 2) implemented by the nonlinear gain block 322 for 90/150/230/265 Vac (input, e.g., Vin') operation at Vin'=11V/30 W (output). As shown by the signal 404, a crossover frequency for Vin'=90 Vac operation is about 2.7 kHz (i.e., a four-times improvement as compared to operation of a conventional power converter as shown by the plots 202 in FIG. 2). Additionally, as shown by the signals 405/406/407, a crossover frequency of about 3.7 kHz is achieved for 150/230/265 Vac operation, respectively. As compared to the signals 204 through 207, shown in FIG. 2, which vary significantly as a function of input voltage, the signals 404 through 407 shown in FIG. 4 are advantageously tightly grouped as input voltage (i.e., Vin') varies.

As a result of the increased control-to-output DC gain $G_{dc}$ and higher crossover frequency (as compared to that of a conventional power converter), a bulk output ripple of the power converter 100 operating at 90 Vac/47 Hz is advantageously three-times lower than a bulk output ripple of the conventional power converter.

Figure 5B:
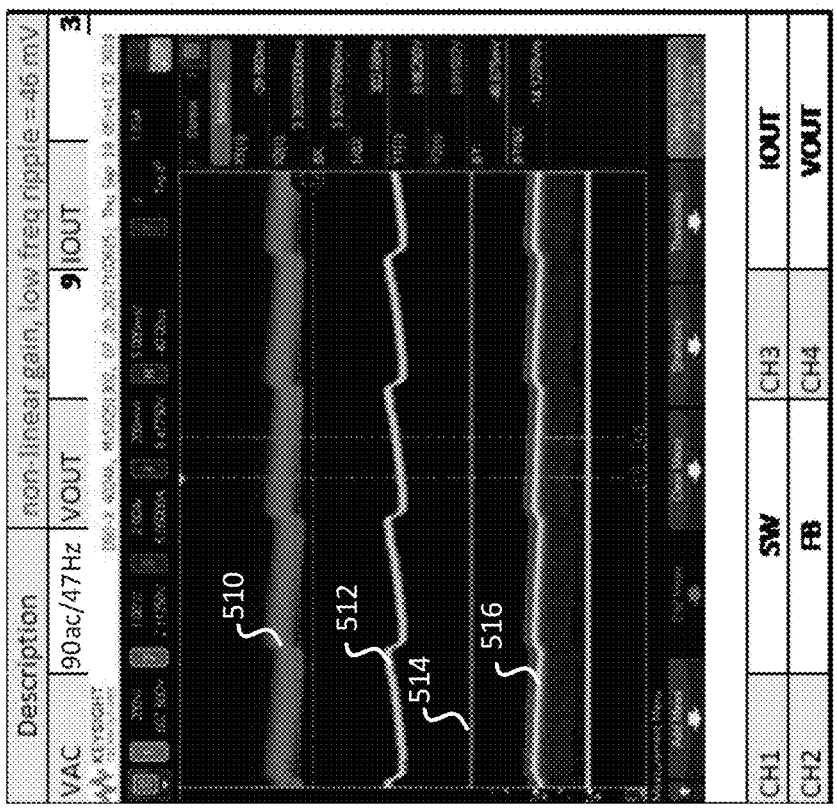
FIG. 5B shows simplified plots of signals related to operation of the power converter shown in FIG. 1, in accordance with some embodiments.
Figure 5A:
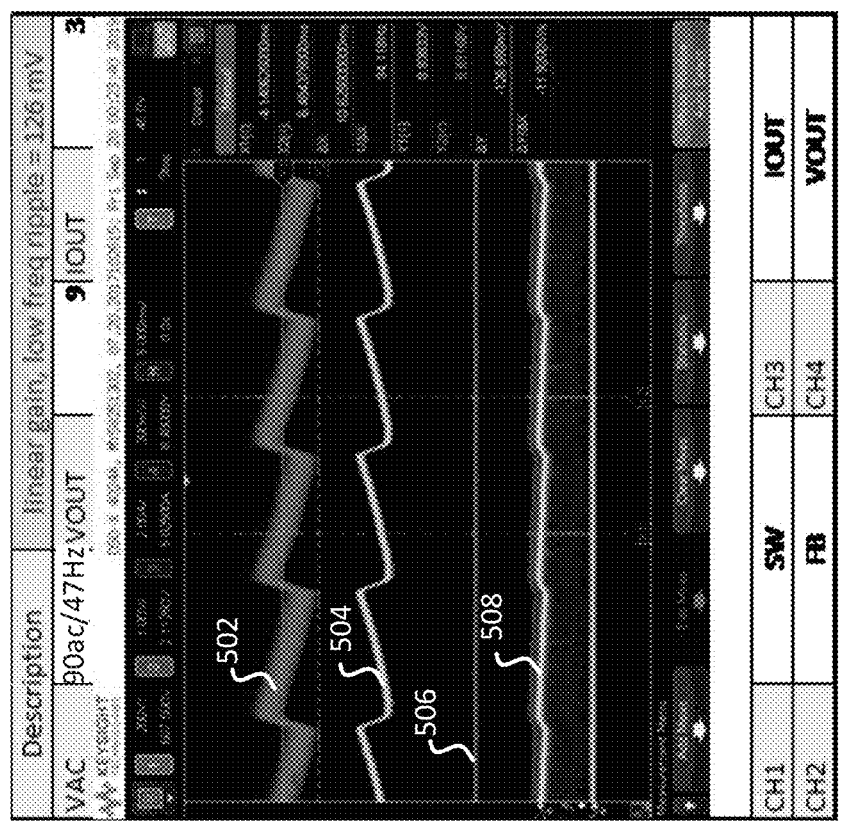
FIG. 5A shows simplified plots of signals related to operation of a conventional power converter.

FIG. 5A shows a simplified plot illustrating operation of a conventional power converter (e.g., a flyback converter, not shown) given a 90 Vac/47 Hz input voltage. Signal 502 is indicative of an output voltage of the conventional power converter, signal 504 is indicative of a feedback signal of the conventional power converter, signal 506 is indicative of an output current of the conventional power converter, and signal 508 is indicative of a switch signal of the conventional power converter. By comparison, FIG. 5B shows a simplified plot illustrating operation of the power converter 100 at Vin'=90 Vac/47 Hz, in accordance with some embodiments. Signal 510 is indicative of the output voltage Vout of the power converter 100, signal 512 is indicative of the feedback signal FB of the power converter 100, signal 514 is indicative of an output current of the power converter 100 (e.g., through the load $R_L$), and signal 516 is indicative of a switch signal of the power converter 100. As shown, a low-frequency AC line component ripple in the signal 510 of the power converter 100 is reduced to 46 mV as compared to a 126 mV ripple in the signal 502 of the conventional power converter shown in FIG. 5A, thus, illustrating an improvement in the performance of the power converter 100.

Figure 6B:
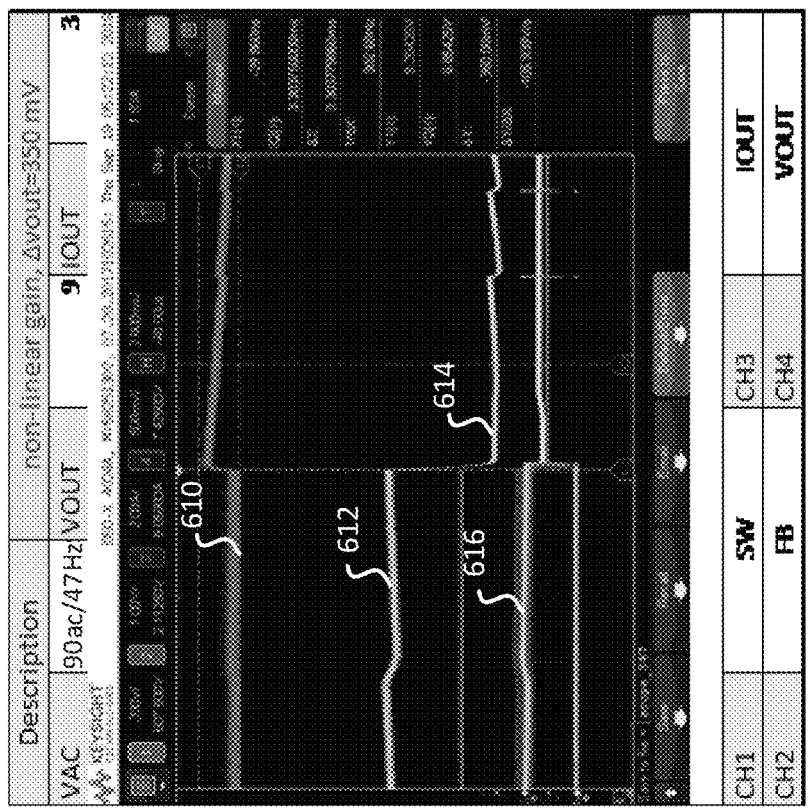
FIG. 6B shows simplified plots of signals related to operation of the power converter shown in FIG. 1, in accordance with some embodiments.
Figure 6A:
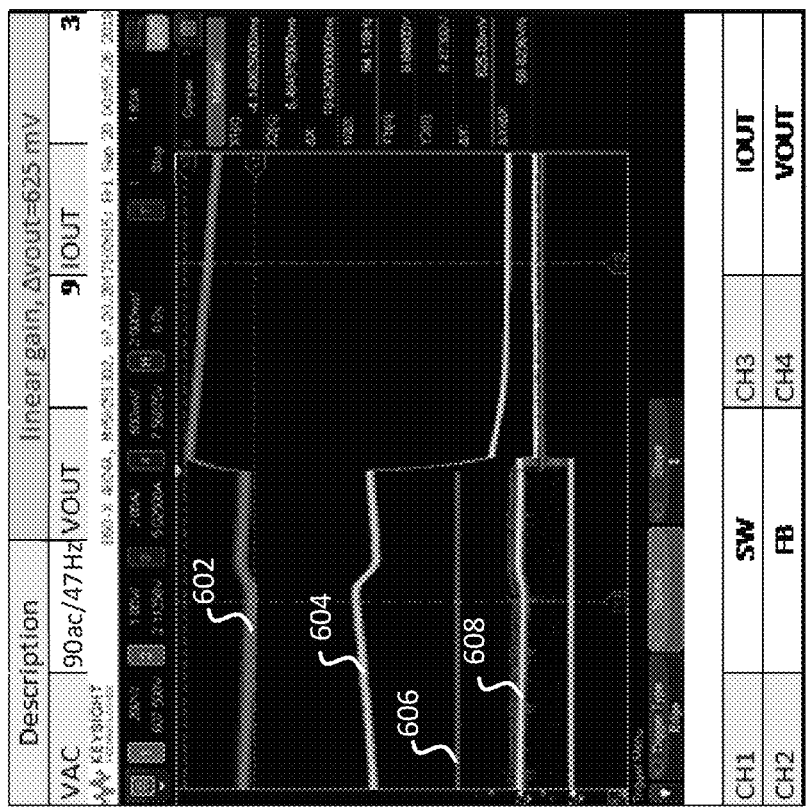
FIG. 6A shows simplified plots of signals related to operation of a conventional power converter.

FIG. 6A shows a simplified plot illustrating operation of a conventional power converter (e.g., a flyback converter, not shown) during 3 A to 0 A load transients at 90 Vac/47 Hz. Signal 602 is indicative of an output voltage of the conventional power converter, signal 604 is indicative of a feedback signal of the conventional power converter, signal 606 is indicative of an output current of the conventional power converter, and signal 608 is indicative of a switch signal of the conventional power converter. By comparison, FIG. 6B shows a simplified plot illustrating operation of the power converter 100 during 3 A to 0 A load transients at Vin'=90 Vac/47 Hz, in accordance with some embodiments. Signal 610 is indicative of the output voltage Vout of the power converter 100, signal 612 is indicative of the feedback signal FB of the power converter 100, signal 614 is indicative of an output current of the power converter 100, and signal 616 is indicative of a switch signal of the power converter 100. As shown, the effect of improved (e.g., higher) crossover frequency with respect to output voltage deviation during load transients at Vin'=90 Vac/47 Hz is approximately two-times (350 mV as shown in FIG. 6B vs. 625 mV as shown in FIG. 6A). That is, the low-frequency AC line component ripple is reduced from 625 mV in the signal 602 as shown in FIG. 6A as compared to 350 mV in the signal 610 of the power converter 100 as shown in FIG. 6B, thus, further illustrating an improvement in the performance of the power converter 100.

Figure 7:
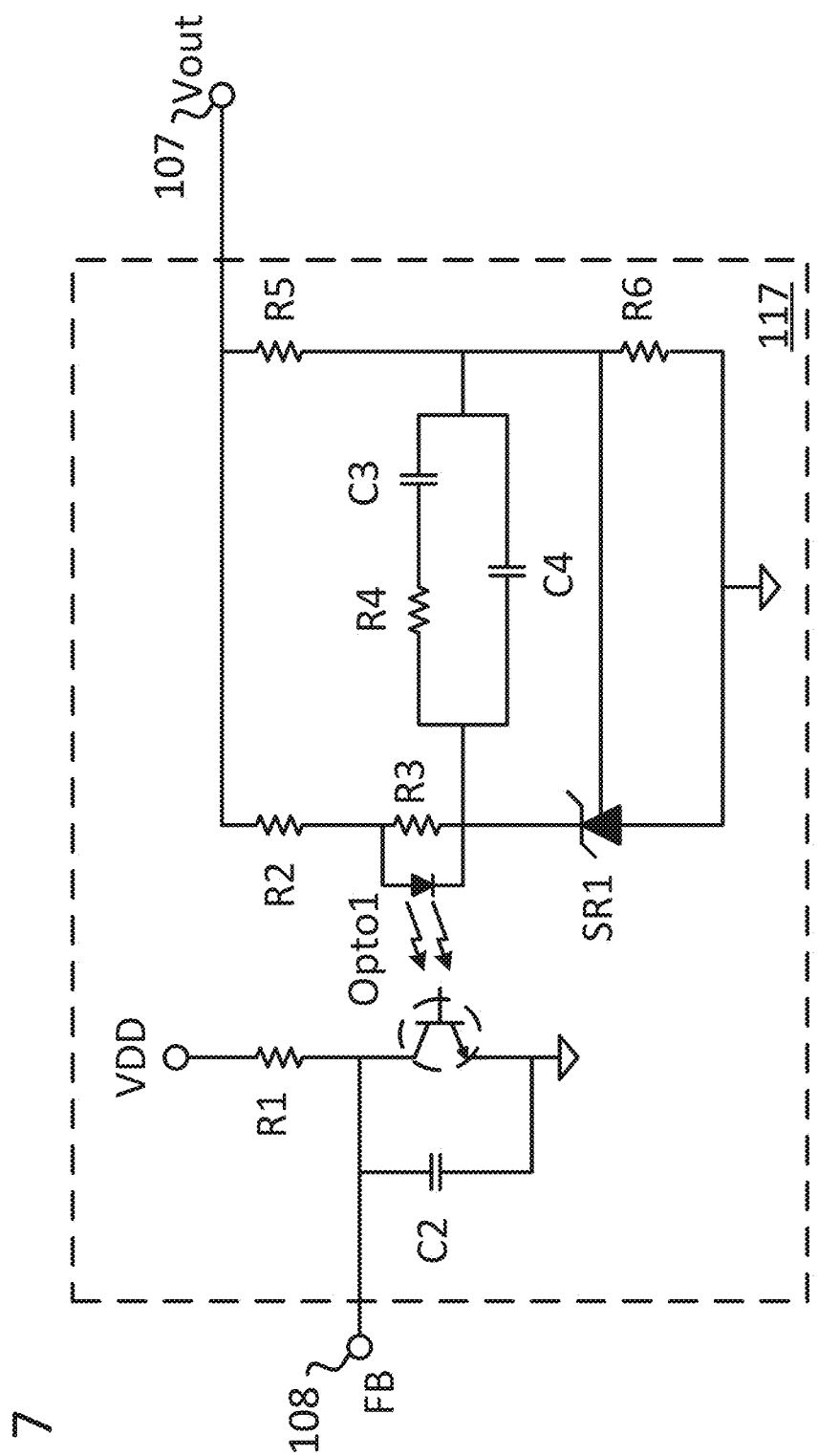
FIG. 7 is a simplified circuit schematic of a compensator for use in the power converter shown in FIG. 1, in accordance with some embodiments.

Another advantage of digital nonlinear transformation for voltage-mode control of the power converter 100 is that a primary-side feedback pullup resistance (e.g., of a compensator/isolation circuit) can be increased by approximately two-times, thereby reducing a quiescent current of the power converter 100 as compared to that of a conventional power converter. For example, FIG. 7 is a simplified circuit schematic of the compensator 117 for use in the power converter 100, in accordance with some embodiments. The compensator 117 generally includes resistors R1-R6, capacitors C2-C4, an optocoupler Opto1, and an adjustable Zener shunt regulator SR1, coupled as shown. As a result of increased small-signal control-to-output DC gain $G_{dc}$ provided by the nonlinear gain block 322, the pullup resistor R1 can advantageously be increased as compared to a pullup resistor of a conventional power converter, thereby reducing a quiescent current generated by operating voltage VDD. A resistance r1 of pullup resistor R1 relates to a DC gain of the power converter 100 as illustrated in the following equation:

$$\frac{FB}{Vout} = -CTR \times \frac{r1}{r3} \quad (5)$$

where the ratio of FB to Vout is indicative of a DC gain, r1 is a resistance of the resistor R1, r3 is a resistance of the resistor R3, and CTR is a current transfer ratio of the optocoupler Opto1. The adjustable (e.g., programmable) Zener shunt regulator SR1 is operable to set a target voltage (e.g., an indication of a desired output voltage) of the power converter 100. In some embodiments, the Zener shunt regulator SR1 is a three-terminal adjustable shunt regulator producing a reference voltage that can be varied (e.g., by using the resistors R5, R6). In some embodiments, the reference voltage produced by the Zener shunt regulator SR1 can be varied between 2.5 V and 36 V.

Figure 8:
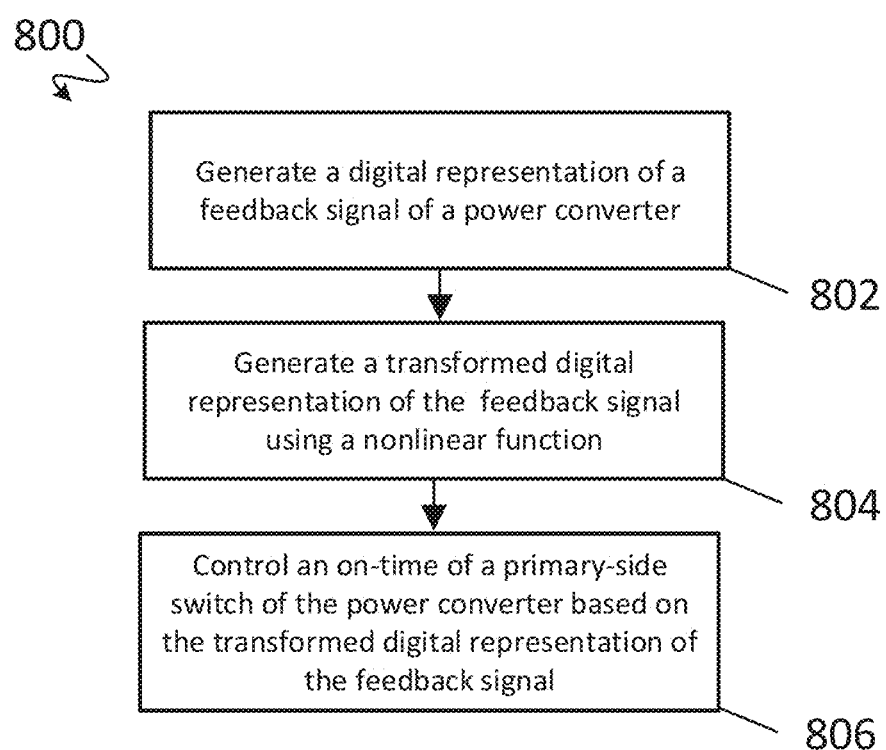
FIG. 8 is a portion of an example process for operation of the power converter shown in FIG. 1, in accordance with some embodiments.

FIG. 8 is a portion of an example process 800 for voltage-controlled feedback of a power converter using a digital nonlinear transformation function, in accordance with some embodiments. The particular steps, order of steps, and combination of steps are shown for illustrative and explanatory purposes only. Other embodiments can implement different particular steps, orders of steps, and combinations of steps to achieve similar functions or results. At step 802, a digital representation (FB(n)) of a feedback signal (FB) of a power converter (e.g., the power converter 100) is generated (e.g., by the ADC 320). At step 804, the digital representation of the feedback signal is transformed using a nonlinear function (e.g., by the nonlinear gain block 322), then at step 806, an on-time ($t_{on}$) of a primary-side switch (e.g., M1) of the power converter is controlled based on the transformed digital representation ($FB^{nl}(n)$) of the feedback signal.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A method, comprising:
generating, by an analog to digital converter (ADC) of a power converter controller, a digital representation of a feedback signal of a power converter, the feedback signal being received from a compensator of the power converter and being based on an output voltage of the power converter;
receiving, by a nonlinear gain block of the power converter controller, the digital representation of the feedback signal;
generating, by the nonlinear gain block of the power converter controller, a transformed digital representation of the feedback signal using a nonlinear function; and
controlling, by a switch control block of the power converter controller, an on-time of a primary-side switch of the power converter based on the transformed digital representation of the feedback signal.

2. The method of claim 1, further comprising:
increasing, by the switch control block of the power converter controller, the on-time of the primary-side switch if the output voltage of the power converter is lower than a target voltage; and
decreasing, by the switch control block of the power converter controller, the on-time of the primary-side switch if the output voltage of the power converter is higher than the target voltage.

3. The method of claim 1, further comprising:
generating, by the switch control block of the power converter controller, a switching signal to control the primary-side switch, the switching signal being a pulse-width modulation (PWM) signal characterized by a duty-cycle that is a ratio of the on-time of the primary-side switch to an off-time of the primary-side switch and a switching frequency that is kept substantially constant when the on-time of the primary-side switch is controlled by the switch control block.

4. The method of claim 1, wherein:
the nonlinear function transforms the digital representation of the feedback signal such that a total DC gain of the power converter is independent of the on-time of the primary-side switch.

5. The method of claim 1, wherein:
the nonlinear function transforms the digital representation of the feedback signal such that a first crossover frequency of the power converter for a first voltage level of an input voltage of the power converter is about equal to a second crossover frequency of the power converter for a second voltage level of the input voltage.

6. The method of claim 5, wherein:
the first voltage level is about 150 Vac and the second voltage level is about 265 Vac.

7. The method of claim 5, wherein:
the on-time of the primary-side switch is controlled, by the switch control block, independently of a switching frequency of the primary-side switch.

8. The method of claim 1, further comprising:
receiving, by a gate driver circuit of the power converter, a switching signal from the switch control block of the power converter controller; and
generating, by the gate driver circuit of the power converter, a switch control signal based on the switching signal, the switch control signal controlling the on-time and an off-time of the primary-side switch;
wherein:
the switching signal is a pulse-width modulation (PWM) signal characterized by a duty-cycle that is a ratio of the on-time of the primary-side switch to the off-time of the primary-side switch and a switching frequency that is substantially constant.

9. The method of claim 1, wherein:
the nonlinear function is a quadratic or higher order function.

10. The method of claim 1, wherein:
the nonlinear function comprises squaring the transformed digital representation of the feedback signal.

11. A method comprising:
controlling, by a primary-side switch of a power converter, a primary-side current through primary-side windings of a transformer of the power converter;
producing, by an output buffer circuit of the power converter coupled to secondary-side windings of the transformer, an output voltage of the power converter;
receiving, by a compensator of the power converter, the output voltage;
producing, by the compensator of the power converter, a feedback signal based on the output voltage;
receiving, by a power converter controller of the power converter, the feedback signal;
generating, by a nonlinear gain block of the power converter controller, a transformed representation of the feedback signal using a nonlinear function; and
controlling, by a switch control block of the power converter controller, an on-time of the primary-side switch of the power converter based on the transformed representation of the feedback signal.

12. The method of claim 11, wherein:
generating, by the switch control block of the power converter controller, a switching signal to control the primary-side switch, the switching signal being a pulse-width modulation (PWM) signal characterized by a duty-cycle that is a ratio of the on-time of the primary-side switch to an off-time of the primary-side switch and a switching frequency that is substantially constant.

13. The method of claim 11, wherein:
the nonlinear function transforms a representation of the feedback signal such that a total DC gain of the power converter is independent of the on-time of the primary-side switch.

14. The method of claim 11, wherein:
the compensator comprises a Zener shunt regulator to set a target voltage of the power converter.

15. The method of claim 14, further comprising:
increasing, by the switch control block of the power converter controller, the on-time of the primary-side switch upon determining that the output voltage of the power converter is lower than the target voltage of the power converter; and
decreasing, by the switch control block of the power converter controller, the on-time of the primary-side switch upon determining that the output voltage of the power converter is higher than the target voltage of the power converter.

16. The method of claim 11, wherein:
the nonlinear function transforms a representation of the feedback signal such that a first crossover frequency of the power converter for a first voltage level of an input voltage of the power converter is about equal to a second crossover frequency of the power converter for a second voltage level of the input voltage.

17. The method of claim 16, wherein:
the first voltage level is about 150 Vac and the second voltage level is about 265 Vac.

18. The method of claim 11, wherein:
the on-time of the primary-side switch is adjusted, by the switch control block, independently of a switching frequency of the primary-side switch.

19. The method of claim 11, wherein:
the nonlinear function is a quadratic or higher order function.

20. A method, comprising:
receiving, by a nonlinear gain block of a power converter controller, a feedback signal of a power converter;
generating, by the nonlinear gain block of the power converter controller, a transformed representation of the feedback signal using a nonlinear function, the feedback signal being received from a compensator of the power converter and being based on an output voltage of the power converter; and
controlling, by a switch control block of the power converter controller, an on-time of a primary-side switch of the power converter based on the transformed representation of the feedback signal.

\* \* \* \* \*